United States Patent [19]

Brokaw

[11] Patent Number: 5,170,335
[45] Date of Patent: Dec. 8, 1992

[54] PRECISION RECTIFIER SYSTEM WITH DIFFERENTIAL INPUT AND DIFFERENTIAL OUTPUT

[75] Inventor: A. Paul Brokaw, Burlington, Mass.
[73] Assignee: Analog Devices, Inc., Norwood, Mass.
[21] Appl. No.: 786,058
[22] Filed: Oct. 31, 1991
[51] Int. Cl.⁵ .......................................... H02M 7/217
[52] U.S. Cl. ..................... 363/127; 328/26; 307/261
[58] Field of Search .................. 307/261; 324/119; 328/26; 363/81, 84, 89, 125, 127

[56] References Cited

U.S. PATENT DOCUMENTS

| | | | |
|---|---|---|---|
| 3,911,291 | 10/1975 | Rossell | 363/127 |
| 4,307,305 | 12/1981 | Morris | 320/26 |
| 4,523,105 | 6/1985 | Jose et al. | 307/261 |
| 5,122,760 | 6/1992 | Nishijima | 363/127 |

Primary Examiner—William H. Beha, Jr.
Assistant Examiner—Jeffrey Sterrett
Attorney, Agent, or Firm—Iandiorio & Dingman

[57] ABSTRACT

A precision rectifier system with differential input and differential output includes an input differential V/I converter responsive to a bipolar input signal voltage with respect to an input reference potential for providing a differential current representative of the magnitude of the input signal; a matching output differential V/I converter responsive to an output voltage signal with respect to an output reference potential for providing a differential current representative of the magnitude of the output voltage signal; amplifier means, responsive to a difference between the differential currents of the input and output V/I converters for adjusting the output voltage signal to null the differences between the differential currents; and switching means, responsive to the polarity of the bipolar input signal, for switching the polarity of the differential current representative of the magnitude of the input signal for maintaining a single polarity rectified output voltage signal.

8 Claims, 7 Drawing Sheets

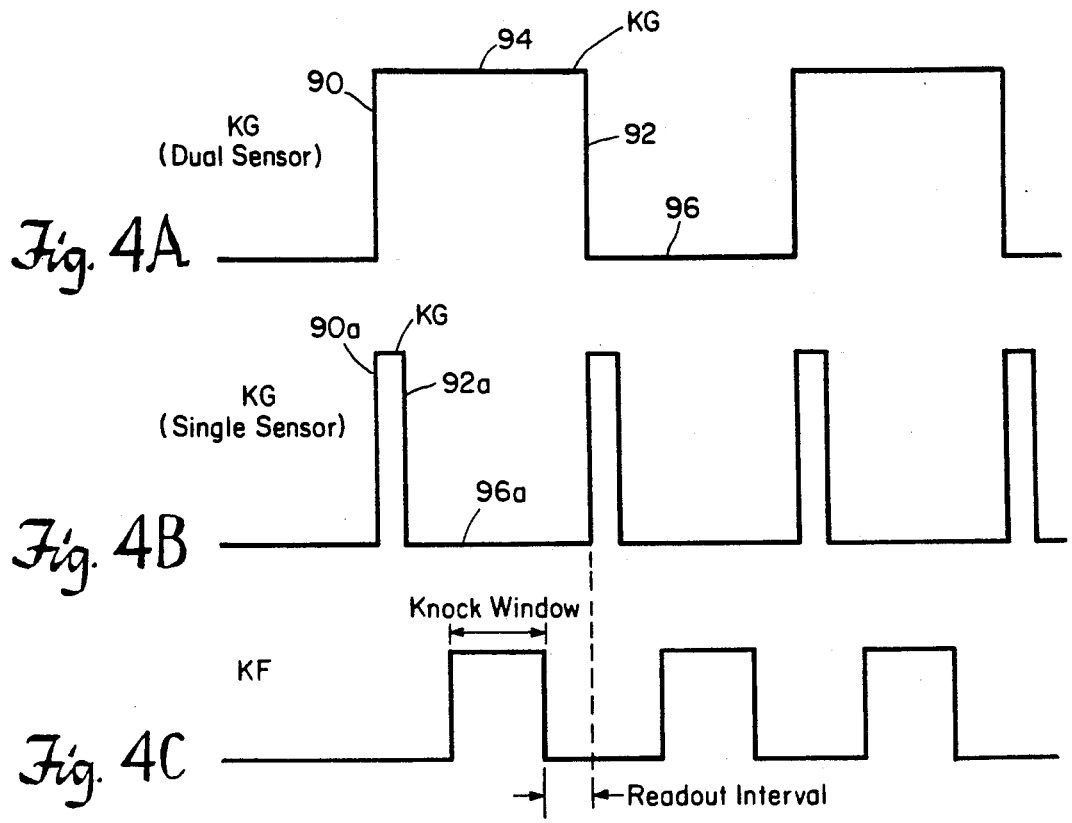
Fig. 4A
Fig. 4B
Fig. 4C
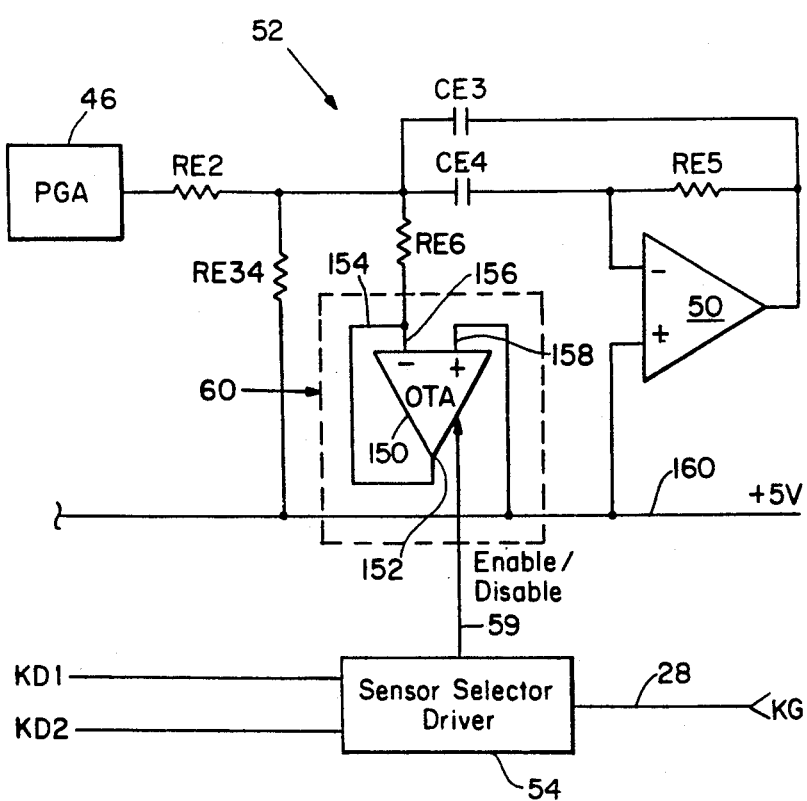
Fig. 6

PRECISION RECTIFIER SYSTEM WITH DIFFERENTIAL INPUT AND DIFFERENTIAL OUTPUT

FIELD OF INVENTION

This invention relates to a precision rectifier system with differential input and differential output, and more particularly to such a system in which the input and output are each defined with respect to independent reference potentials.

BACKGROUND OF INVENTION

Precision rectifiers generally require a common reference between the input and output of the rectifier. However, in some applications, such as precision rectifiers used in signal conditioner systems for knock sensor units associated with control circuits for internal combustion engines, the use of two different references, one for the input and one for the output, are dictated. No such device is presently available. Knock sensor units sense knocking or pre-ignition during engine operation and adjust various parameters such as timing and fuel mixture in order to minimize knocking. Knocking can be caused by a variety of factors including timing, fuel mixture, compression ratio, manifold pressure, exhaust back pressure, and fuel octane rating. Knocking is undesirable because it increases wear and decreases efficiency. A knock sensor unit uses one or more sensors to sense the vibrations caused by the knocking. The detecting of knocking is used to generate a signal which is used by the controller circuit adjust various engine parameters and reduce or eliminate the knocking. A dual reference precision rectifier would be useful in such a system and in other applications.

SUMMARY OF INVENTION

It is therefore an object of this invention to provide a precision rectifier system with separate input and output references.

It is a further object of this invention to provide such a dual reference precision rectifier system in which there is a differential input and a differential output.

It is a further object of this invention to provide such a dual reference precision rectifier system in which the input and output references can be independent and different.

It is a further object of this invention to provide such a dual reference precision rectifier system in which V/I converters can be configured so that the normal mode input controls the rectified signal while the common mode inputs control the reference levels of the rectifier.

The invention results from the realization that a truly simple yet effective precision rectifier whose input and output are independently referenced can be constructed by utilizing the difference between differential currents representative of the input and the output signals to adjust the output signal to null the difference, and by switching the polarity of the differential current representative of the input signal for establishing a rectified output signal of a single polarity, and from the further realization that by using differential V/I converters at the input and output of the rectifier the input and output signals can function as the normal mode signals which vary the differential currents while independent reference potentials can function as the common mode signals which do not affect the differential currents.

This invention features a precision rectifier system with differential input and differential output. There is an input differential V/I converter responsive to a bipolar input signal voltage with respect to an input reference potential for providing a differential current representative of the magnitude of the input signal. A matching output differential V/I converter is responsive to an output voltage signal with respect to an output reference potential for providing a differential current representative of the magnitude of the output voltage signal. Amplifier means responsive to a difference between the differential currents of the input and output of the V/I converters adjusts the output voltage signal to null the difference between the differential currents. Switching means responsive to the polarity of the bipolar input signal switches the polarity of the differential current representative of the magnitude of the input signal for maintaining a single polarity rectified output voltage signal.

In a preferred embodiment the amplifier means may include means for combining the differential currents from the input and output V/I converters. The means for combining may include a load circuit and the load circuit may be an active load circuit. The amplifier means may include a V/I conversion means for converting the rectified output voltage signal to the rectified output current signal. The switching means may include a differential comparator and a reversing switch responsive to the comparator. The differential comparator may include a comparator circuit and a controlled beta flip-flop responsive to the comparator circuit. The controlled beta flip-flop may have beta of approximately 1.

DISCLOSURE OF PREFERRED EMBODIMENT

Other objects, features and advantages will occur to those skilled in the art from the following description of a preferred embodiment and the accompanying drawings, in which.

Figure 2:
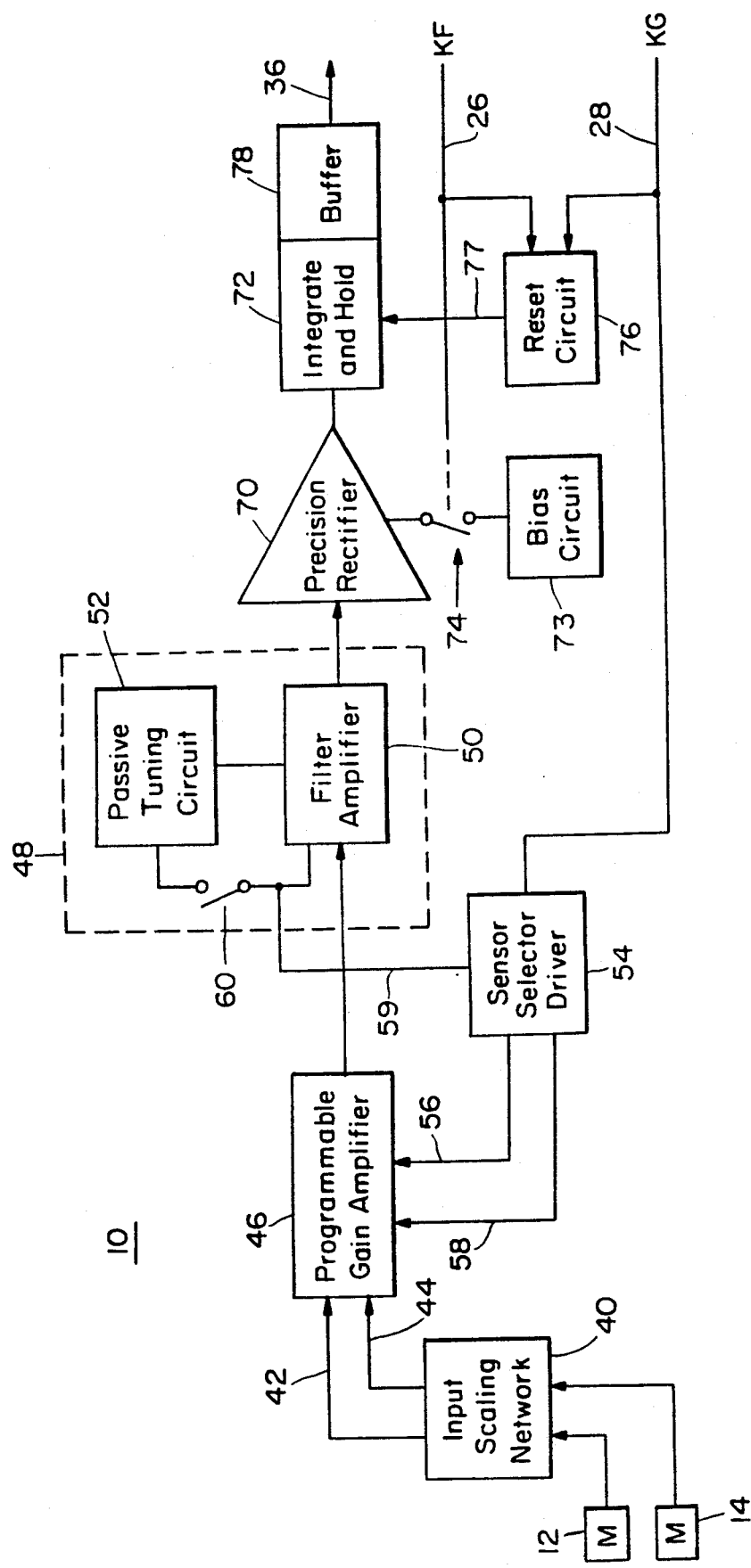
FIG. 2 is a more detailed block diagram of the multiplexed single-channel knock sensor signal conditioner system of FIG. 1.
Figure 5:
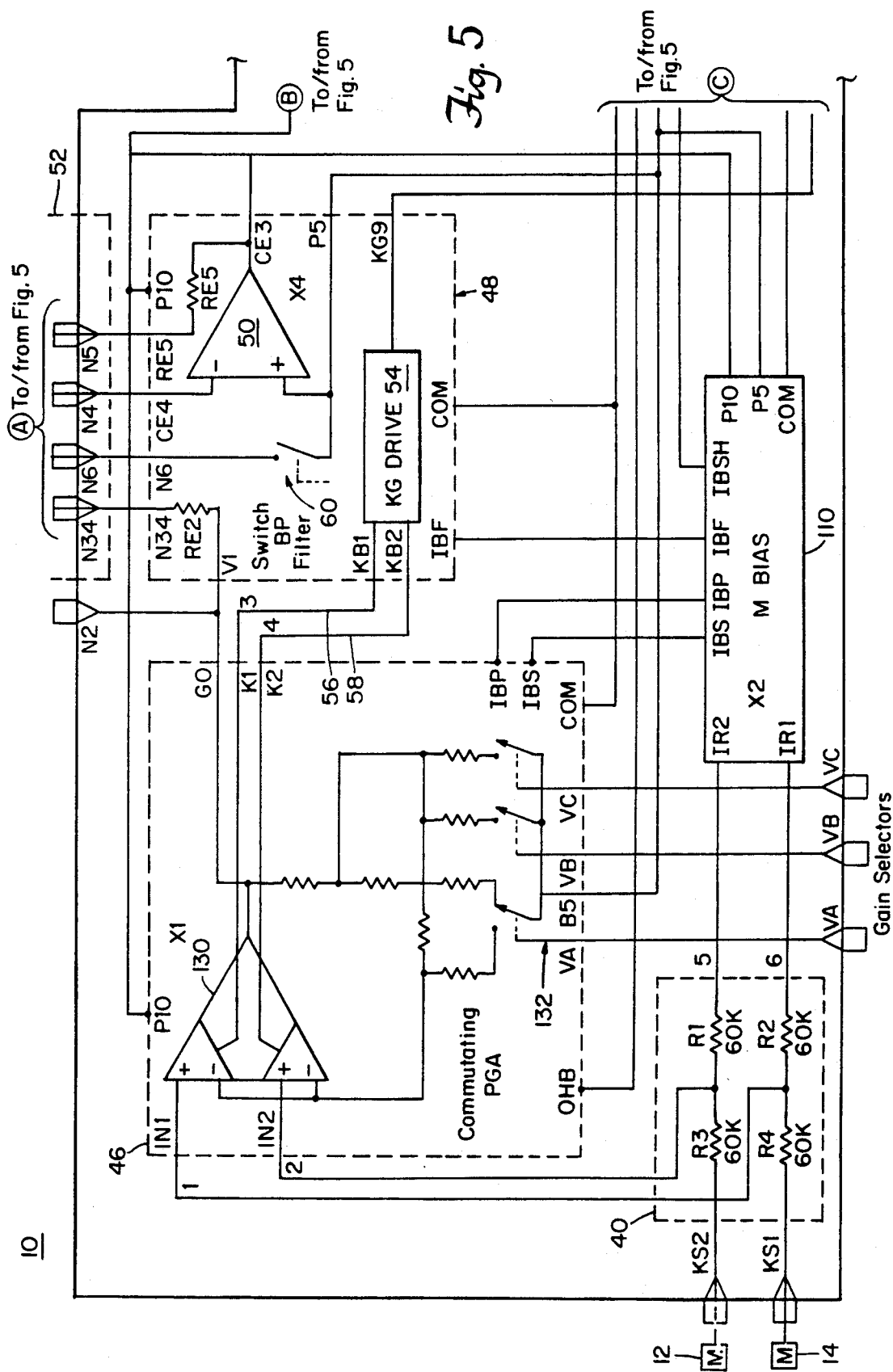
Figure 5:
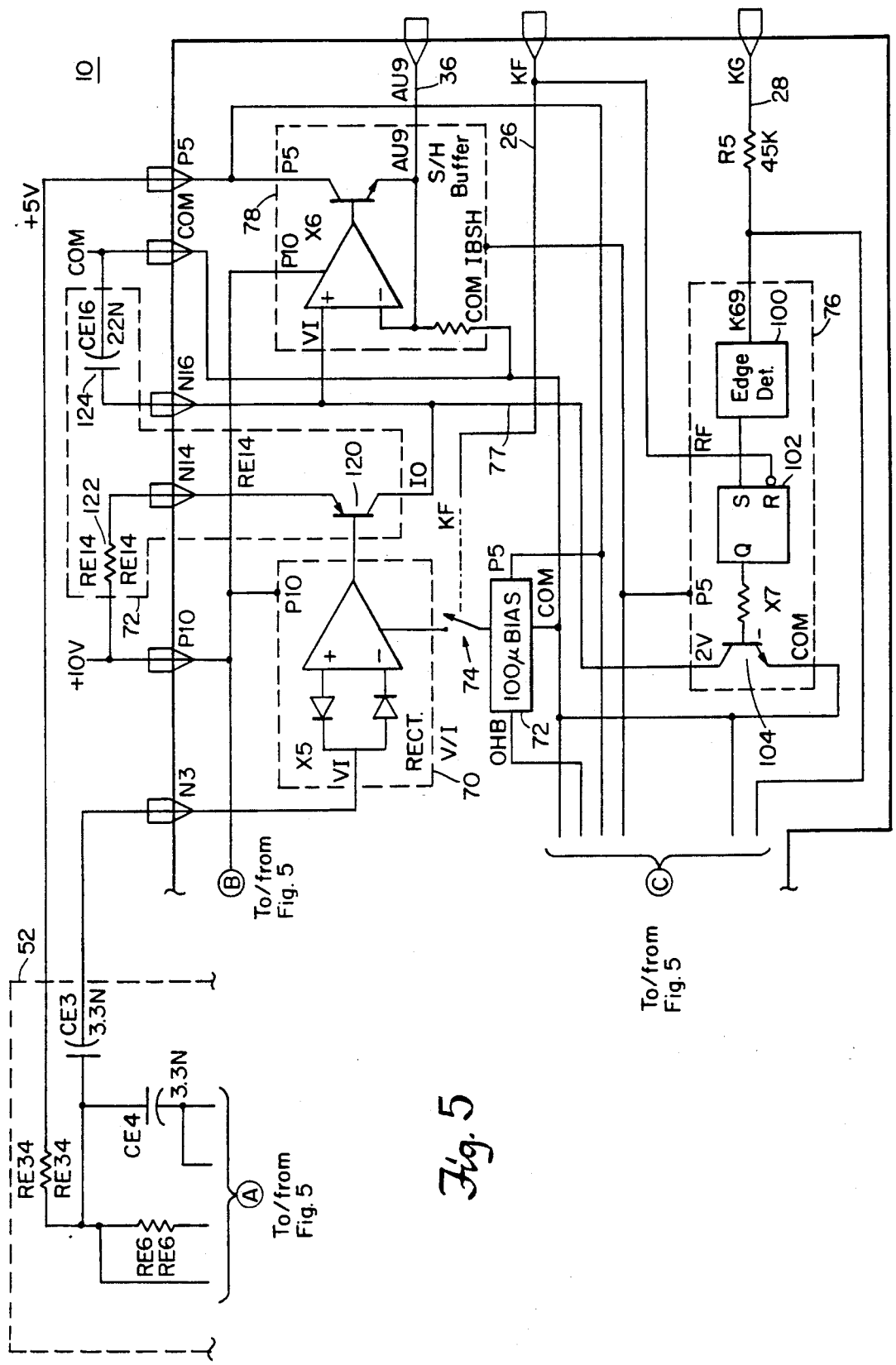
Figure 7:
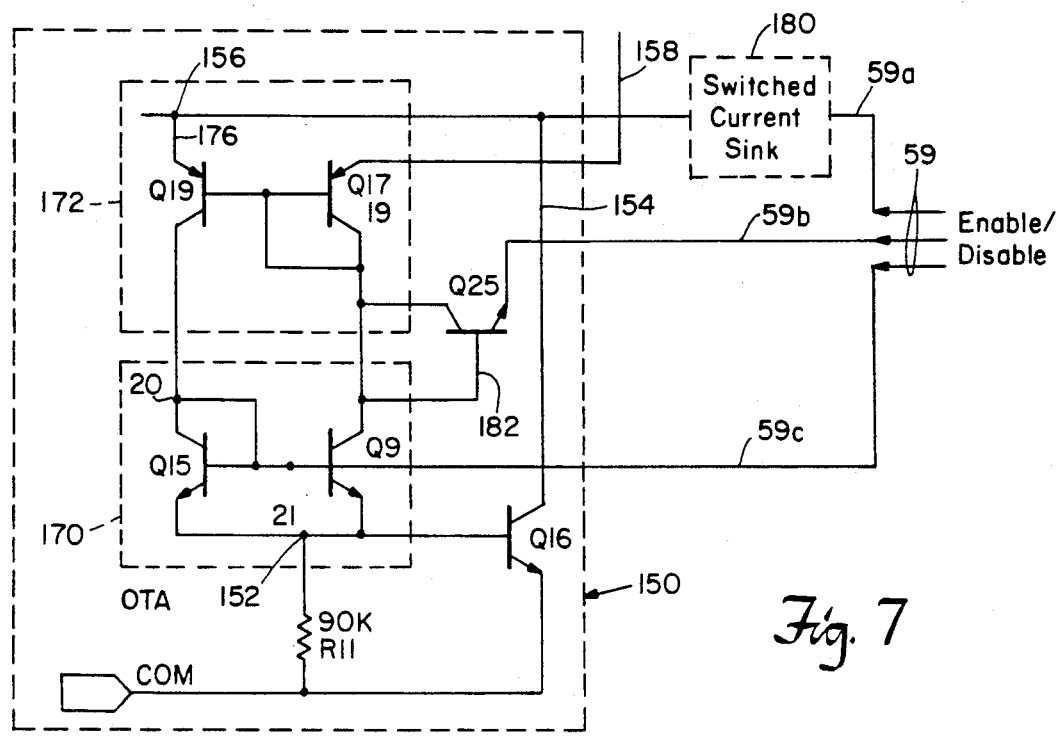
Figure 8:
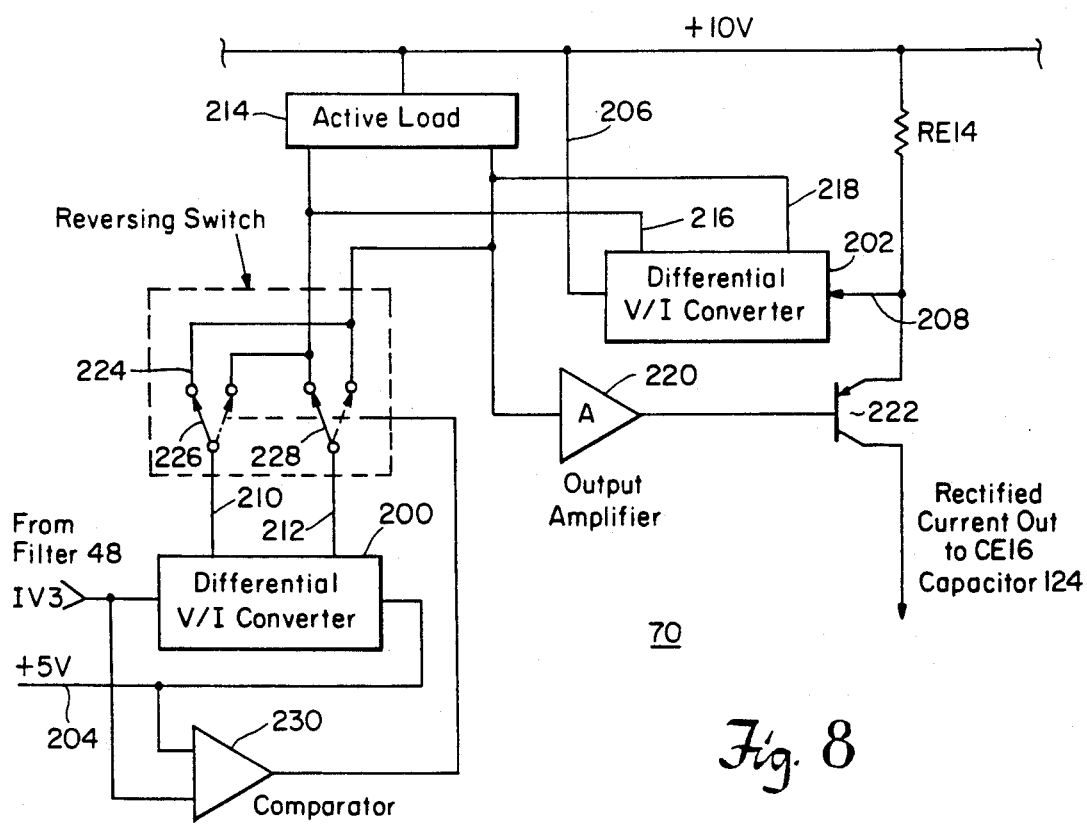
Figure 9:
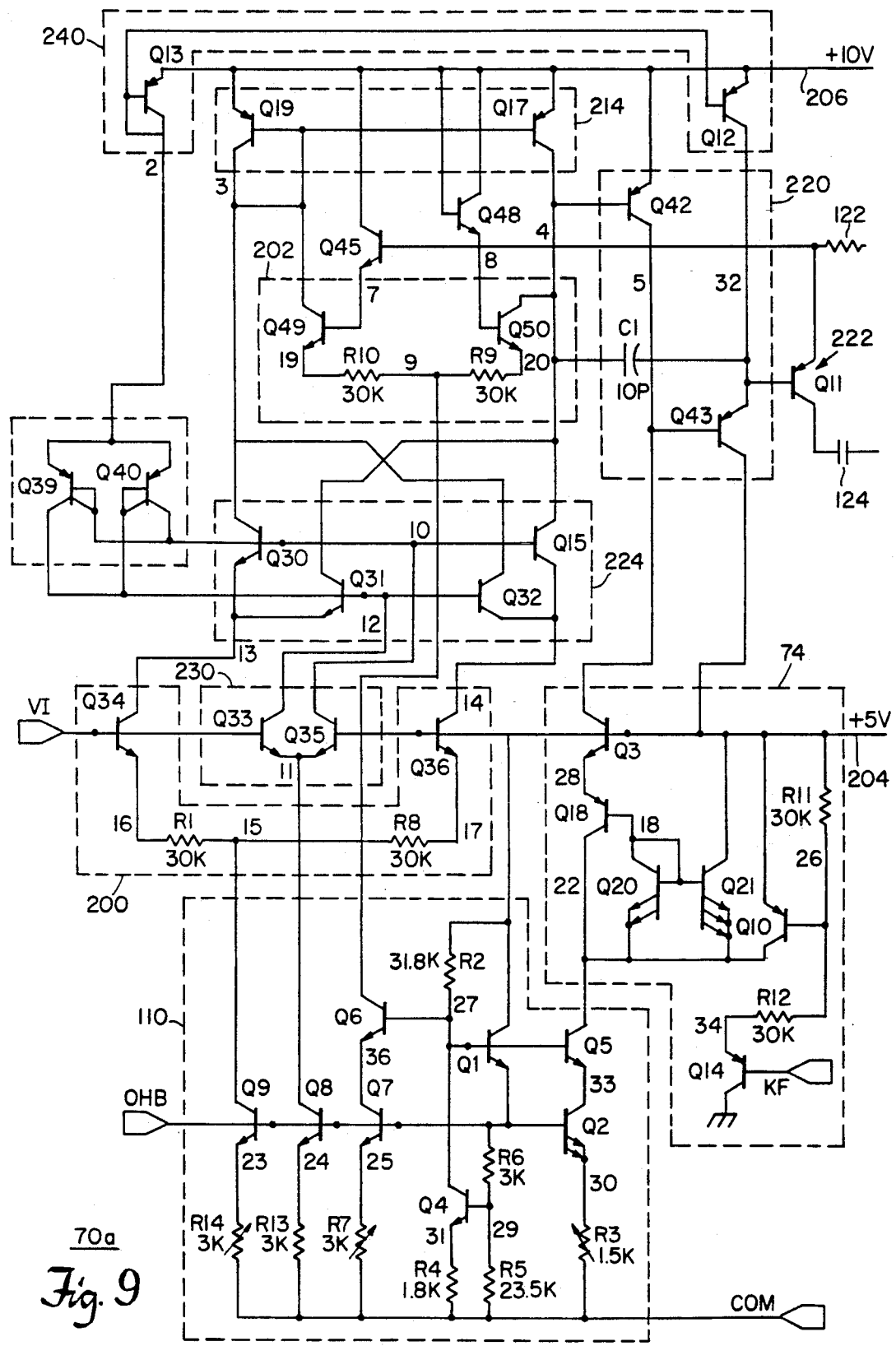

FIGS. 4A, B and C are waveforms used for operating dual sensor and single sensor signal conditioner systems, respectively;

FIG. 5 is a more detailed circuit diagram of the system of FIG. 2;

FIG. 6 is a more detailed block diagram of the multiple feedback bandpass filter of FIG. 2 showing the electronic switch with very low dynamic "on" resistance;

FIG. 7 is a more detailed circuit diagram of the electronic switch of FIG. 6;

FIG. 8 is a more detailed block diagram of the precision rectifier of FIG. 2 according to this invention; and FIG. 9 is a more detailed circuit diagram of the precision rectifier of FIG. 8.

The precision rectifier system with differential input and differential output according to this invention may be accomplished by using an input differential V/I converter responsive to a bipolar input signal voltage with respect to an input reference potential for providing a differential current representative of the magnitude of the input signal, and a matching output differential V/I converter responsive to an output voltage signal with respect to an output reference potential for providing a differential current representative of the magnitude of the output voltage signal. The differential V/I converters need not be linear but they should be matched so that they operate in a similar manner, as is well known in the art. The output will then be linear, even though the circuits themselves may not be. Pairs of these differential V/I converters may be used to make differential differencing amplifiers (DDA); more information on them may be found in E. Sackinger, W. Guggenbuhl, "A o Versatile Building Block: The CMOS Differential Differencing Amplifier", IEEE J. of Solid State Circuits, Vol. SC-22, No. 2, Apr. 1987, pp. 287-294. An amplifier is responsive to the difference between the differential currents of the two V/I converters and adjusts the output voltage signal accordingly to null the difference between the two differential currents. The amplifier typically includes some means for combining the differential currents so that a difference can be detected. That combining means may be a load circuit, which may be active or passive. The amplifier may also include V/I conversion means for converting the rectified output voltage signal to a rectified output current signal. The switching means uses a differential comparator and a reversing switch driven by the comparator. The comparator senses the polarity of the incoming signal and toggles the reversing switch so that the output of the rectifier is always of the same polarity, either negative or positive. The differential comparator includes a comparator circuit and a controlled beta flip-flop for operating the switching means. The controlled beta flip-flop may have a beta of approximately 1. Such a flip-flop is used in order to ensure abrupt switching as the differential signal crosses zero.

Figure 1:
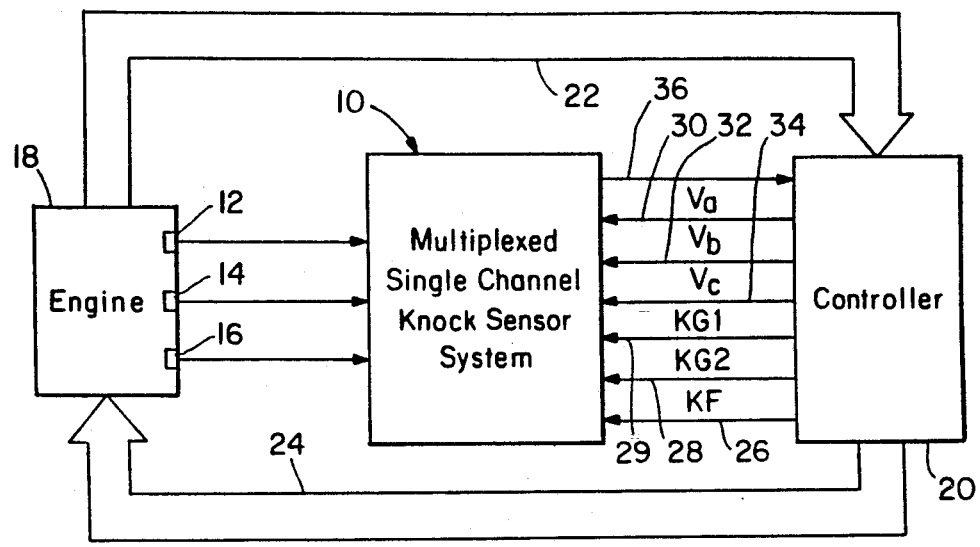
FIG. 1 is a simplified block diagram of a multiplexed single-channel knock sensor signal conditioner system employing the precision rectifier according to this invention installed with a controller for an internal combustion engine.

There is shown in FIG. 1 a multiplexed single-channel knock sensor signal conditioner system 10, FIG. 1, which senses the vibrations indicative of knock through a plurality of audio detectors such as microphones 12, 14 and 16 associated with engine 18. The details of engine 18 and its electronic controller 20 do not form a part of this invention and are well known in the automotive art. Controller 20 receives a number of signals over bus 22 from engine 18 and provides a number of control inputs which relate to the fuel mixture, timing, exhaust gas recirculation, and other parameters, over bus 24. Controller 20 also provides to system 10 signal KF on line 26 which defines the knock window, that is, the period of time during which a knock is to be expected, a selection signals KG1, KG2 on lines 28 and 29 which selectively connect microphones 12, 14 or 16 to system 10; and three voltages Va, Vb and Vc on lines 30, 32 and 34 which control the gain applied by system 10 to the signals from microphones 12, 14 and 16. The output from system 10 representing the magnitude of the knock signal from the currently selected microphone is delivered on line 36 to controller 20.

Multiplexed single-channel knock sensor signal conditioner system 10 is shown in FIG. 2 in one implementation where it services but two sensors, microphones 12 and 14, whose outputs are first delivered to input scaling network 40, after which each of the outputs from sensors 12 and 14 are fed on lines 42 and 44, respectively, to programmable gain amplifier 46. The amplified version of the input signal appearing on line 42 or 44 is delivered to multiple feedback bandpass filter 48 which includes filter amplifier 50 and passive tuning circuit 52. Sensor selection driver 54 responds to the condition of the KG signal on line 28 which enables line 56 to select the output of microphone 12 on line 42 or enables line 58 to select the output of microphone 14 on line 44. Sensor selection driver 54 also operates via line 59 switch 60 in multiple feedback bandpass filter 48 to select the bandpass center frequency associated with the selected microphone.

Commonly, both microphones would be subject to the same center frequency but not always. In cases where there is an asymmetrical signal sensing environment, such as an odd number of cylinders or other differences in the engine design, separate tuning may be required for each of the sensors. The output from filter 48 which accentuates the frequencies in the range associated with the knocking phenomenon and suppresses the others is delivered to precision rectifier 70 which provides a unipolar rectified signal representative of the magnitude of the knock to integrate and hold circuit 72. The output of bias circuit 73 which enables the operation of rectifier 70 is applied to rectifier 70 through switch 74 only during the period of the knock window as determined by the KF signal supplied on line 26. After the end of the knock window and an interval to read the output, sensor select signal KG on line 28 operates reset circuit 76 to reset integrate and hold circuit 72. Upon the occurrence of the next knock window signal KF on line 26, reset circuit 76 is restored so that integrate and hold circuit 72 can once again integrate the signal from precision rectifier 70. The output of integrate and hold circuit 72 is delivered to buffer circuit 78 which delivers the output on line 36 to controller 20.

Figure 3:
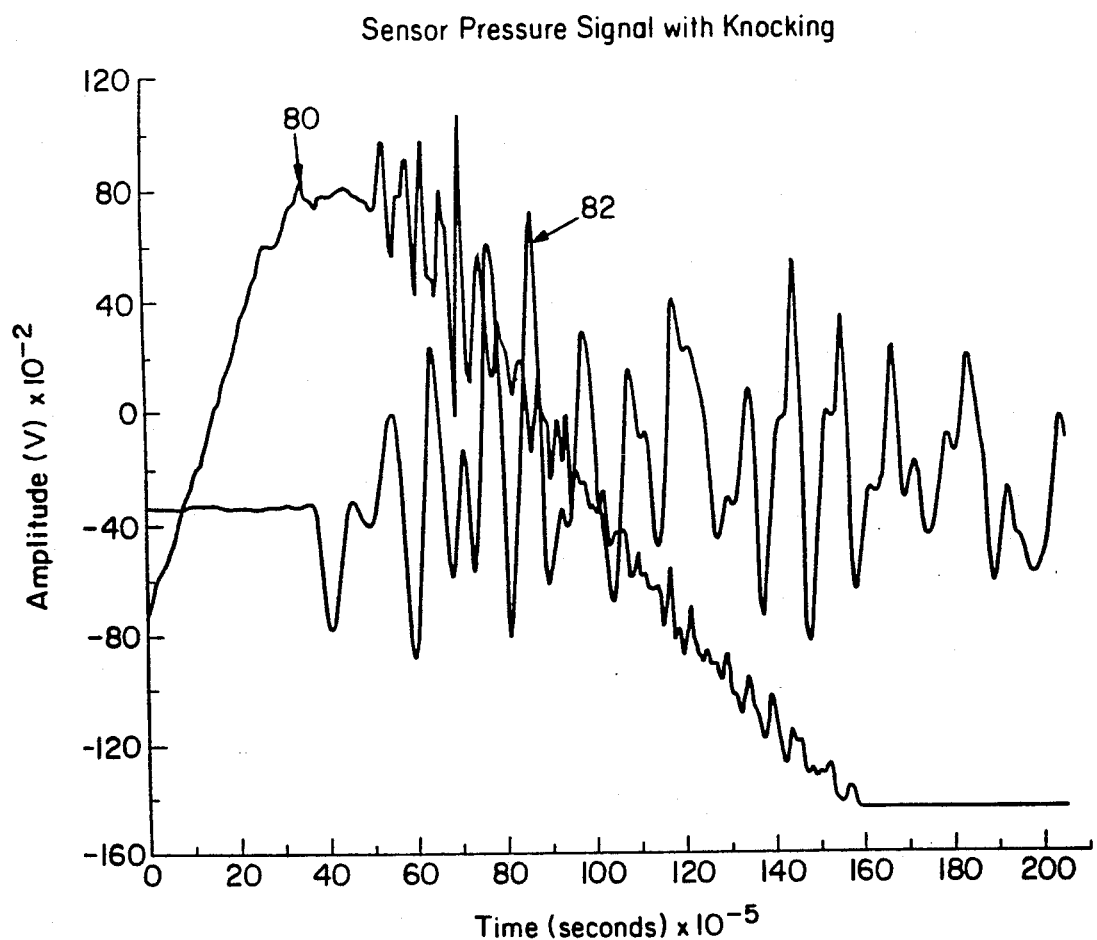
FIG. 3 is a graphical illustration of a plot of amplitude versus time for a typical filtered knock signal superimposed on a typical unfiltered signal from the firing of a single cylinder.

A typical input signal from microphones 12 and 14 is indicated at 80, FIG. 3, for a single cylinder cycle. Also shown in FIG. 3 is the knock signal 82 after it has been filtered by the multiple feedback bandpass filter 48. Bandpass filter 48 generally delivers signals in the range of 5,000-15,000 Hz. The form of the KG signal on line 28, FIG. 2, for a two-microphone system is shown in FIG. 4A. The appearance of an edge, whether it be positive-going 90 or negative-going 92, resets integrate and hold circuit 72 by a signal from reset circuit 76 on line 77 to buffer 78. The polarity of the KG signal following the detected edge indicates which of the microphone inputs is to be selected for delivery to programmable gain amplifier 46. This can be seen in FIG. 5, where the block diagram of FIG. 2 has been shown in somewhat greater detail but still in schematic form. There, reset circuit 76 is shown to include an edge detector 100 responsive to the KG signal on line 28 to operate flip-flop 102 whose Q output is delivered to amplifier 104 that drives line 77 to reset integrate and hold circuit 72. The positive level 94 may dictate the selection of microphone 14, while the negative level 96 may dictate the selection of microphone 12.

If but a single sensor is to be used, for example, microphone 12, the single sensor KG signal, FIG. 4B, can be narrowed so that its edges 90a and 92a are extremely close together and the entire pulse occurs just prior to the knock window defined by signal KF on line 26 so that the programmable gain amplifier 46 is toggled from microphone 12 to microphone 14 and quickly back to microphone 12 so that it constantly services only microphone 12.

The more detailed schematic in FIG. 5 shows the M bias circuit 110 which is not depicted in FIG. 2. This circuit provides the bias requirements of all the various components of system 10. The remainder of FIG. 5 simply shows in greater detail the implementation of system 10 as depicted in FIG. 2. For example, integrate and hold circuit 72 is shown to include transistor 120, resistor 122 and the integrating capacitor 124. Programmable gain amplifier 46 shows an amplifier 130 and a switching network 132 which applies the gain selection inputs Va, Vb, Vc. The tuning of filter 48 shows that switch 60 either connects or disconnects resistor RE6 in passive tuner circuit 52 to provide two bandpass center frequencies, one for each microphone 12 and 14. Of course when more sensors are utilized, switch 60 becomes more complex in order to control additional resistors and the KG signal will require a second bipolar signal, which can then be used to control three or even four different sensors. Additional sensors can be serviced in a similar manner.

Electronic switch 60, FIG. 6, employs an operational transconductance amplifier 150 whose output 152 is connected directly through shunt 154 to its inverting input 156. Its non-inverting input 158 is connected to +5 volt reference potential on line 160. Operational transconductance amplifier 150 is enabled and disabled by the signal on line 59 from sensor selection driver 54.

When amplifier 150 is operating, it provides a low-impedance virtual potential at the inverting input 156 which is approximately the same as the reference (+5 v) potential, and when the amplifier is disabled its out provides a high impedance at inverting input 156. The low-impedance condition is typically less than one ohm.

Operational transconductance amplifier 150 may include a current mirror circuit 170, FIG. 7, which includes transistors Q15 and Q9 regeneratively fed by emitter coupled input stage 172 which includes transistors Q19 and Q17. Resistor R11 is a biasing resistor which ensures at least a minimum current in the input stage. Transistor Q16 responds to the output from current mirror 170 and feeds it back on line 154 to the input of emitter coupled input stage 172. Transistor Q16 functions as an inverting amplifier so that line 174 provides a negative feedback. When transconductance amplifier 150, FIG. 7, is operating, it is in its nature to have a very low input impedance at its inverting input 156. When it is not operating it is also in its nature to have a very high impedance at its inverting input 156.

The enable/disable line 59 actually includes three paths. The signal on line 59a supplies the operating current for Q16. A switched current sink 180 may be provided to control that current so that the circuit operates as a class A amplifier. The signal on line 59b operates diode 182 which provides a starting current to initiate operation of the amplifier. The signal on line 59c holds down the voltage on the bases of Q15 and Q9 when the circuit is disabled to prevent any current from flowing into the base of Q16 thereby keeping the amplifier off.

The precision rectifier 70, FIG. 2, according to this invention is shown employed in a multiplexed single-channel knock sensor signal conditioner system but is not limited to use in only this environment.

Precision rectifier 70 is shown in greater detail in FIG. 8 as including an input differential V/I converter 200 and an output differential V/I converter 202. Converter 200 has as its common mode input a 5-volt reference potential on line 204, while converter 202 has an independent and in fact different, reference potential of ten volts delivered on line 206 to its common mode input. The normal mode input to converter 200 comes from filter 48, FIG. 2, while the normal mode input to converter 202 on line 208 is actually the output which in FIG. 2 is delivered to integrate and hold circuit 72. The differential current output on lines 210 and 212 of converter 200 is delivered to active load 214. The differential current on lines 216 and 218 of converter 202 is also fed to active load 214 where they are combined with those currents on lines 210 and 212. The difference between these differential currents is sensed by output amplifier 220. Any difference causes amplifier 220 to increase or decrease the current drawn through the V/I conversion means embodied in transistor 222. Thus notwithstanding any differences in the common mode inputs on lines 204 and 208, the response of system 70 to changes in the normal input to converter 200 from filter 48 is directly linearly followed by converter 202, and the common mode inputs may be independent and may be different as they are in this case where one is +5 volts and one is +10 volts.

In order to maintain a single polarity output through resistor RE14, transistor 222, and on line 208, a reversing switch 224 feeds the output of lines 210 and 212 to the same inputs of active load 214 as lines 216 and 218 in one condition and switches them in the other condition. Thus if a negative rectified output is desired, switch 224 will have its swingers 226 and 228 in the dashed position when the input pulse is negative and in the full line position when the input pulse is positive, so that the output is always negative. It is comparator circuit 230 that senses the polarity of the incoming signal from filter 48 and sets switch 224 accordingly.

A more detailed implementation 70a of the rectifier of FIG. 8 is shown in FIG. 9. There it can be seen that converter 200 includes transistors Q36 and Q34 as well as resistors R1 and R8. Converter 202 includes transistors Q49 and Q50 along with resistors R9 and R10. Comparator 230 includes transistors Q33 and Q35, reversing switch 224 includes switching transistors Q15, Q30, Q31 and Q32 as well as transistors Q39 and Q40 connected as a controlled beta flip-flop. The active load 214 is shown to include two transistors Q17 and Q19, which are employed to raise the overall gain. Emitter follower amplifiers Q45 and Q48 are not indicated in FIG. 8, nor is biasing network 240 shown including transistors Q13 and Q12. Transistor Q13 sets the diode drop, approximately 0.6 volts, for transistors Q39 and Q40 so that switching occurs around the right quiescent point. Transistors Q12 and Q13 of biasing circuit 240 are configured as a current mirror so that they also reflect the proper current for transistor Q43, which in conjunction with transistor Q42 make up output amplifier 220. Switch 74, FIG. 5, is shown in greater detail as is bias circuit 110. Switch 74 supplies or withholds bias current, derived from Q2, to the amplifier stage Q42, FIG. 9, to enable or disable the rectifier in response to KF. The amplifier 220 causes Q11 to be driven so that the rectified signal voltage appears across RE14. In so doing Q11 is forced to deliver a current from its collector to CE16 which is proportional to the rectified filter signal and inversely proportional to RE14.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A precision rectifier system with differential input and differential output comprising:
   an input differential V/I converter responsive to a bipolar input signal with respect to an input reference potential for providing a differential current representative of the magnitude of the input signal;
   a matching output differential V/I converter responsive to the output voltage signal with respect to an output reference potential for providing a differential current representative of the magnitude of the output voltage signal;
   amplifier means, responsive to a difference between the differential currents of the input and output V/I converters, for adjusting the output voltage signal to null the difference between those differential currents; and
   switching means, responsive to the polarity of the bipolar input signal for switching the polarity of the differential current representative of the magnitude of the input signal for maintaining a single polarity rectified output voltage signal.

2. The precision rectifier system with differential input and differential output of claim 1 in which said amplifier means includes means for combining the differential currents from the input and output V/I converters.

3. The precision rectifier system with differential input and differential output of claim 2 in which said means for combining includes a load circuit.

4. The precision rectifier system with differential input and differential output of claim 3 in which said load circuit is an active load circuit.

5. The precision rectifier system with differential input and differential output of claim 3 in which said amplifier means includes a V/I conversion means for converting said rectified output voltage signal to a rectified output current signal.

6. The precision rectifier system with differential input and differential output of claim 1 in which said switching means includes a differential comparator and a reversing switch responsive to said comparator.

7. The precision rectifier system with differential input and differential output of claim 6 in which said differential comparator includes a comparator circuit and a controlled beta flip-flop responsive to said comparator circuit.

8. The precision rectifier system with differential input and differential output of claim 7 in which said controlled beta flip-flop has a beta of approximately one.

* * * * *